United States Patent [19]

Obenschain

[11] 4,194,150

[45] Mar. 18, 1980

[54] METHOD AND APPARATUS FOR REDUCING MAGNETOMETER ERRORS

[75] Inventor: Arthur W. Obenschain, Silver Spring, Md.

[73] Assignee: The United States of America as represented by the Secretary of the Navy, Washington, D.C.

[21] Appl. No.: 763,758

[22] Filed: Sep. 26, 1958

[51] Int. Cl.² ........................................... G01R 33/02
[52] U.S. Cl. .................................................. 324/245
[58] Field of Search ................. 324/43, 34, 8, 47, 245, 324/246

Primary Examiner—Theodore M. Blum
Attorney, Agent, or Firm—R. S. Sciascia; A. L. Branning

EXEMPLARY CLAIM

1. A method of correcting errors in the electrical characteristics of a total field magnetometer after the magnetometer is tested and said errors are measured and resolved, which comprises correcting the core turnover errors in said total field magnetometer by replacing a pair of cores thereof with a new pair of cores having the same total reductance as the first pair and the difference in reductance of the replaced cores different than the difference in reductance of the cores which are replaced, and subsequently correcting the block misparabolism errors in said magnetometer by adjusting at least one of the cores of the magnetometer to a new angular setting thereof so that the indication of field strength will be within prescribed limits of accuracy.

1 Claim, 7 Drawing Figures

U.S. Patent  Mar. 18, 1980  Sheet 1 of 2  4,194,150
FIG.1.
FIG.2.
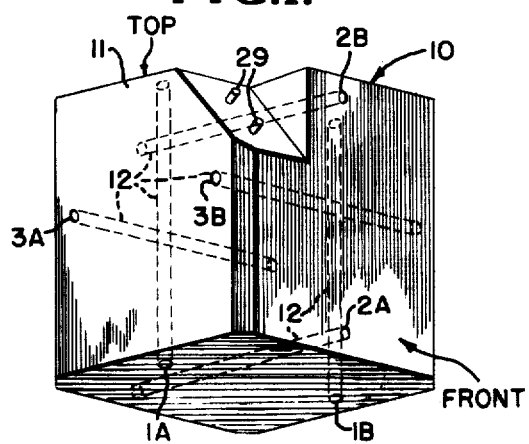
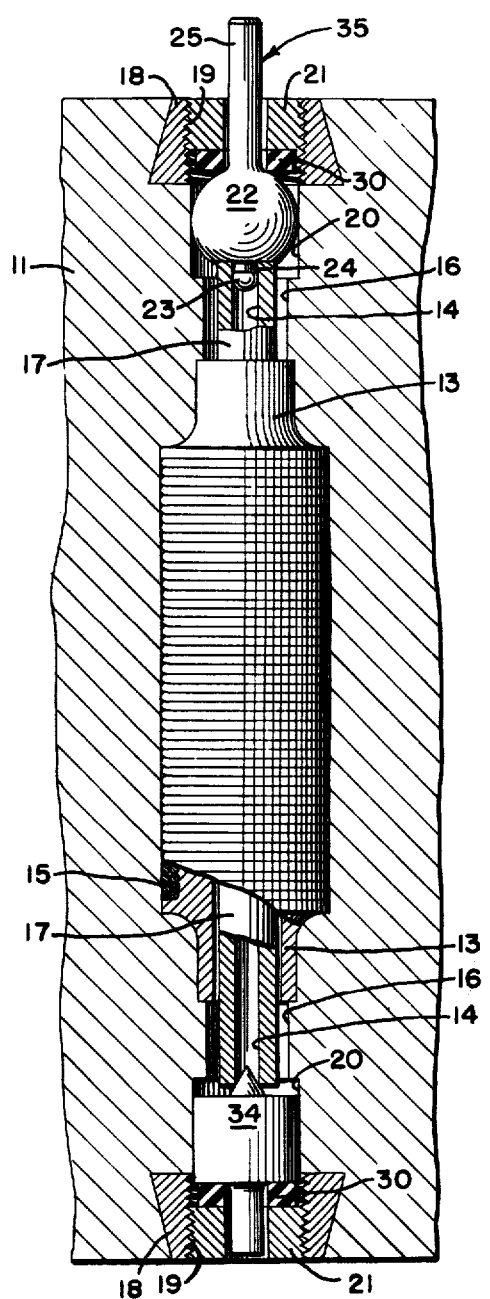
FIG.3.
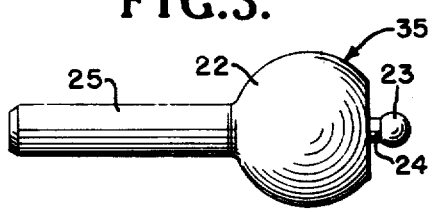
FIG.4.
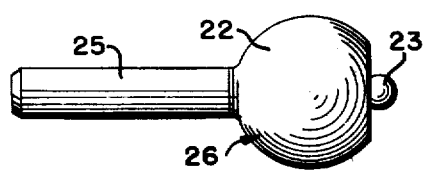
FIG.5.
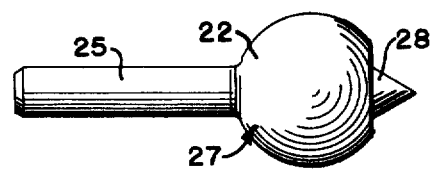

METHOD AND APPARATUS FOR REDUCING MAGNETOMETER ERRORS

The invention described herein may be manufactured and used by or for the Government of the United States of America for governmental purposes without the payment of any royalties thereon or therefor.

This invention relates to magnetometers and more particularly to a method and apparatus for reducing errors as a result of turnover and block misparabolism during the manufacture of a total field magnetometer.

A total field magnetometer of the type contemplated by the present invention consists of three pairs of magnetometer elements arranged in three mutually perpendicular planes. Each of these magnetometer elements consists of a coil centered on a low retentivity magnetic core of high permeability. A suitable value of alternating current is applied to the coils in series. The reduction in inductance (reductance) of each coil from its value in zero magnetic field is proportional to the square of the field strength along its axis. Since the axes of the three pairs of coils are mutually perpendicular, the total inductance of the coils will be constant ideally regardless of the position in which the magnetometer is placed with respect to an external constant magnetic field. Stated differently, the total inductance of the magnetometer, regardless of its orientation in a magnetic field, is proportional to the sum of the squares of the three field components, and this sum is the square of the magnetic field strength sensed by the magnetometer. A perfect total field magnetometer thus can be subjected to any and all motions both translatory and rotative in a magnetic field of constant magnitude and its inductance will remain unchanged.

In actual practice it has been found that the inductances of all total field magnetometers manufactured in accordance with existing methods and processes undergo some changes as the magnetometers are subjected to motion in a constant or uniform magnetic field. As a result of extensive study and experimentation it has been found that these motional errors in inductance caused erroneous indications of the field strength as the result of motion of the magnetometer within the field and are defined herein as magnetometer errors. These errors may be conveniently divided into four primary components as follows:

(1) A reductance component of error is present when the reductance of each pair of magnetometer elements in the magnetometer is not equal to the reductance of any other pair of magnetometer elements. It has been found that during manufacture of the magnetometer such reductance errors may be corrected by changing the magnetic cores in the elements until a reductance match between each pair of magnetometer elements is achieved. Furthermore, reductance errors in completely assembled magnetometers may be corrected by the method and apparatus described in patent application, Ser. No. 278,514 of Joseph C. Bregar, filed Mar. 25, 1952 of which the Government is a licensee.

(2) A core misparabolism component of error is present when the inductance of each magnetometer element under the application of a magnetic field does not vary parabolically as the field magnitude is increased to a maximum value of approximately 1 gauss. This type of error can be reduced to substantially zero during the manufacture of the magnetometer by exercising care in the fabrication, annealing, and selection of the magnetometer cores and by driving the magnetometer with a suitable oscillator. If the magnetometer is manufactured or used with an oscillator that accentuates core misparabolism, this condition may be corrected by selected shunt capacitance connected across the magnetometer as described in patent application, Ser. No. 278,514 supra.

(3) A turnover component of error is present when there is a difference in the reductance of any pair of magnetometer elements when the pair of elements is aligned first parallel to a magnetic field and then antiparallel with respect to the field. The term antiparallel as employed herein may be defined as a position which the magnetometer assumes when it has been rotated through an angle of exactly 180° about an axis normal to the direction of the magnetic field being set and the magnetometer has been brought to rest parallel to the field in a position reversed from the initial position which the magnetometer occupied. Heretofore, turnover errors have not been measured with specificity and there has been no known way of correcting such errors due to turnover. By employing the present invention such turnover errors are now readily measured and corrected during the manufacturing process of the magnetometer.

(4) A block misparabolism component of error is present when the effective magnetic axes of the three pairs of magnetometer elements are not exactly orthogonal. Heretofore it has not been possible to measure such misparabolism errors as distinguished from core misparabolism errors and obviously, prior to the instant invention, there has been no method or means of correcting such block misparabolism errors. By employing the teaching of the present invention, block misparabolism errors are readily measured and corrected during the manufacturing process for the magnetometer.

Total field magnetometer are particularly suited for use with ordnance devices for sensing the changes in the earth's magnetic field as a result of the magnetic field of an enemy vessel superimposed thereon. Under certain conditions of service these changes in field are very small at the point sensed by the total field magnetometer and obviously to be suitable for such an ordnance application the magnitude of the signal generated by the magnetometer when the magnetic field of the vessel is sensed thereby must exceed the spurious signal generated by the magnetometer in response to angular movement within a uniform magnetic field such, for example, as might be caused by angular movement of a depth charge when employed therein as a firing control element.

By employing the apparatus and process of the instant invention the percentage of total field magnetometers which were rejected because of imperfections therein detected during the manufacture and test thereof has been substantially reduced and those magnetometers which otherwise would be rejected by reason of turnover errors or block misparabolism were rendered acceptable for service use by employing the teaching of the present invention.

One of the objects of this invention is to provide a method for determining turnover errors in a total field magnetometer and to correct these errors as a part of the manufacturing process thereof.

Another object is to provide a method for determining block misparabolism errors in a total field magnetometer and to provide means and a method for correcting such errors during the manufacturing process.

Still another object is a method and means for detecting and correcting both turnover errors and errors due to block misparabolism in a total field magnetometer.

Still other objects, advantages and improvements will be apparent from the following description taken in connection with the accompanying drawings of which:

FIG. 1 is a view in perspective of a total field magnetometer on which is shown in dashed outline the internal location of the magnetometer elements;

FIG. 2 is a fragmentary enlarged view partially broken away of a portion of the magnetometer block of FIG. 1 on which is shown one of the magnetometer elements and mounting means therefor;

FIG. 3 is a greatly enlarged view of an element employed with the magnetometer of FIG. 1 for adjusting the magnetometer elements thereof in accordance with a preferred embodiment of the invention;

FIG. 4 is a view of the adjusting element of FIG. 3 according to an alternative form thereof;

FIG. 5 is a view of still another form of adjusting element;

Figure 7:
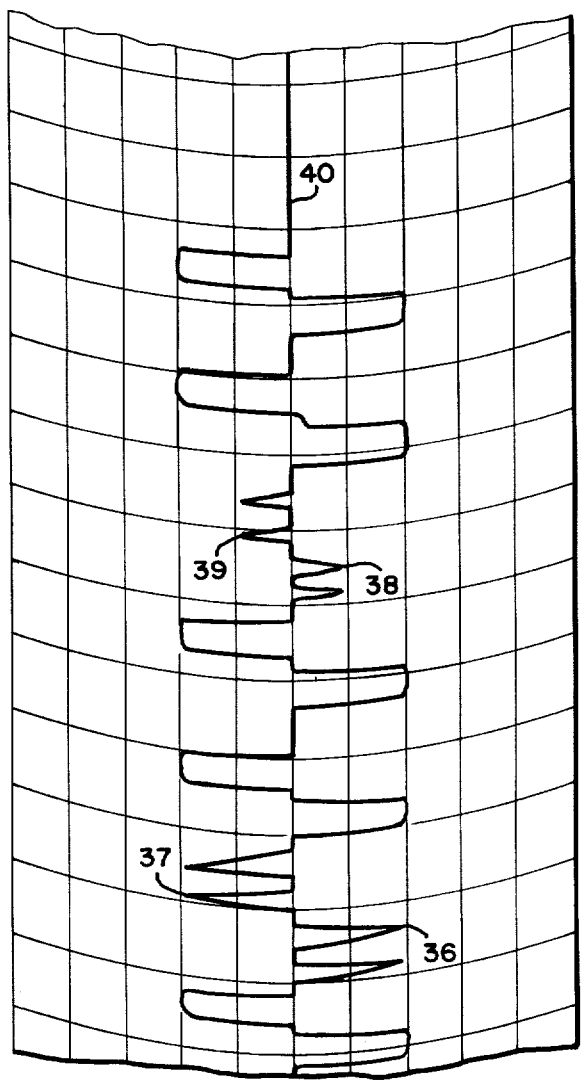
FIG. 7 is a curve depicting variations of field strength indication in the electrical characteristics of the magnetometer during a testing operation.

Referring now to the drawings on which like numerals of reference are employed to designate like or similar parts throughout the several views and more particularly to FIG. 1 thereof, there is shown therein a total field magnetometer designated generally by reference numeral 10 comprising a block 11 of molded material suitable for the purpose having a plurality of magnetometer elements 12 molded therein. The coil block molds 11 are manufactured to very tight tolerances (0.000125 inch on linear dimensions and ¼ minute on angular dimensions). Regardless of such tight tolerances, however, block misparabolism errors may be present which limit the reduction that can be made in over all magnetometer errors, these block misparabolism errors being of sufficient magnitude to render the total field magnetometer unsuitable for the purpose intended.

Each magnetometer element comprises a non-magnetic coil form composed of material suitable for the purpose such, for example, as a material known in the art as Nylon. A coil of wire 15 is wound around the coil form 13 and the coil form and coil are molded within the block 11 in such manner that the axis thereof is in alignment and communicates with a pair of bores 16 disposed within opposite portions of the block respectively in such manner that, the magnetometer elements are arranged in pairs, each pair being disposed in a plane mutually perpendicular to the planes of the other pairs. The coil form 13 is provided with a bore therein within which is disposed a tube or sleeve 17 composed of a material known in the art as alundum to which the thin tubular permalloy core 14 is secured interiorly, there being sufficient clearance between the form 13 and tube 17 to permit a limited degree of angular movement therebetween. There is also molded within the block 11 a plurality of inserts 18 composed of non-magnetic material suitable for the purpose such, for example, as Bakelite and threaded interiorly as at 19 to receive a plug 21 threadedly disposed therein. Each of the inserts 18 is in communication with a recess or bore 20 in alignment with the recess 16. Within one recess 20 of each pair of such recesses is disposed an adjustable member 35 comprising a spherical portion 22 held therein by plug 21 in such manner that the member is movable angularly within recess 20 to an adjusted position and thereafter held in the adjusted position by friction applied thereto by the plug 21 and resilient washer 30 disposed therebetween and cemented to the plug 21. The other end of tube 17 is held by a cylindrical plug fitted within a bore 20 and provided with a conical end portion for fixed engagement with an end of tube 17.

The adjustable member 35 is provided with a spherical member 23, FIGS. 2 and 3, preferably connected thereto as by a stem or stud 24 for engagement with the inner end portion of tube 17. The member 35 is also provided with a shank 25 of sufficient length to project outwardly from plug 21 to be manually adjustable to a selected adjusted position. Angular movement of the shank 25 causes movement of the end of tube 17 connected thereto by spherical member 23 whereby the axis of the permalloy core may be varied angularly with respect to the block 11.

Whereas this structure has been described with particularity with reference to FIG. 3, it is equally applicable to the adjustable member 26 of FIG. 4 or the adjustable member 27 of FIG. 5. The member 26 of FIG. 4 is interchangeable with member 35 of FIG. 3 and differs from the member 35 only in the omission of the stud 24. The adjustable member 27 of FIG. 5 differs from the adjustable members of FIGS. 3 and 4 only by the substitution of a conical element 28 for the spherical element 23, the conical element 28 being similar to the conical element shown on FIG. 2 and of sufficient size to engage the inner surface of an end portion of tube 17 to provide an operative connection therebetween.

Figure 6:
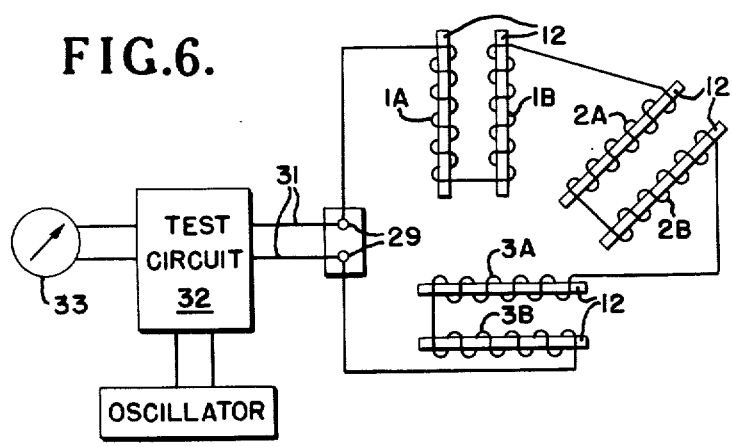
FIG. 6 is a circuit diagram showing the magnetometer elements connected in a testing and measuring circuit for determining the electrical characteristics of the magnetometer under test.

On FIG. 6 is shown the three pairs of magnetometer elements 12 connected in series to the terminals 29 carried by the coil block 11 from whence the circuit is continued by conductors 31 to a test circuit 32. The test circuit comprises an inductance bridge to which the magnetometer is connected. A 3,000 cycle per second alternating current supplied by a well regulated oscillator is applied to the bridge and has been found to be satisfactory for the purpose. The bridge is adjusted to a slight unbalance so that a 3,000 cps carrier voltage is transmitted to a high frequency amplifier. The output of the amplifier is rectified and fed to a d-c amplifier and recording milliammeter 33. The standing rectified voltage is balanced out with a bucking voltage source so that high sensitivity may be employed, as is well known in the art of magnetometer testing.

Heretofore magnetometers have been constructed by selecting cores so that the sum of the reductances of each of these three pairs of cores, designated 1, 2 and 3 comprising core pairs 1A-1B, 2A-2B, and 3A-3B respectively, FIG. 1, were equal, with no restriction on the reductance match between the cores comprising each pair. In accordance with this invention, the turnover error in each pair of cores is measured and then corrected independently by adjusting the reductance match between the two cores designated A and B of each pair. After the turnover error has been corrected the block error is measured and then corrected by adjustment of the angular position of the cores within the coils.

The method employed to achieve this result will now be described in greater detail. The magnetometer connected as shown on FIG. 6 is placed in a unidirectional uniform magnetic field with core pair No. 1 parallel to this field. The uniform magnetic field employed for this purpose may conveniently be obtained from a Helmholtz coil within which the magnetometer is disposed. The recording milliammeter 33 is now calibrated in terms of milligauss by changing the superposed field by a known amount and the change in the milliammeter deflection is noted, such adjustment as may be required being made in the d-c amplifier gain to obtain suitable scale readings.

The magnetometer block is now rotated through an angle of 180° about a line passing through the midpoint of the magnetometer and parallel to the core pair No. 3 such that core pair No. 1 is antiparallel to the superposed field. The difference in reductances, i.e. the difference in the deflections of the recording milliammeter with core pair No. 1 first parallel to the superposed field and then antiparallel to the superposed field is a direct measure of the turnover error in core pair No. 1. The turnover or turnover error is designated positive if the measured reductance is higher with the cores antiparallel than with the cores parallel to the superposed field, and the turnover is designated negative if the measured reductance is lower with the cores antiparallel than with the cores parallel to the superposed field.

If the core turnover in the assumed case is positive, select new cores for replacement of cores 1A and 1B so that the sum of the reductances is unchanged but the reductance of core 1A is increased and the reductance of core 1B is decreased. The difference in the reductances of cores 1A and 1B required for a particular positive turnover correction is determined through previous emperical trial and error measurements of change in turnover for a given change in reductance match. If the turnover error in core pair No. 1 is negative, select new cores for replacement of cores 1A and 1B so that the sum of the reductances is unchanged but the reductance of core 1A is decreased and the reductance of core 1B is increased. As in the previous assumed case, the difference in the reductances of cores 1A and 1B required for a given negative turnover correction is determined through emperical trial and error measurements. The turnover test is repeated with the newly selected cores in core positions 1A and 1B. If, in the assumed example, some turnover error is still present, a final selection is made of cores 1A and 1B so that the sum of their reductances is unchanged and the difference between the reductances, again determined by emperical measurements, is as required to eliminate the remaining turnover error. In the same manner the turnover errors in core pairs Nos. 2 and 3 are corrected in turn.

After the core turnover error has been corrected, block misparabolism errors are corrected by adjustment of the adjustable end plug members 35. The magnetometer is again placed in a unidirectional uniform magnetic field, after connection to the test circuit, with core pair No. 1 parallel to this field. The recording milliammeter is now calibrated in terms of milligauss by changing the superposed field by a known amount. When this has been done the change in the milliammeter deflection is observed and such adjustment made as may be required in the d-c amplifier gain to obtain suitable scale readings.

The magnetometer block is now rotated or tilted through an angle of 90° about a line passing through the midpoint of the magnetometer and parallel to core pair No. 3 so that core pair No. 2 is parallel to the superposed field. The magnetometer block is now rotated through an angle of 90° back to the starting position so that core pair No. 1 is again parallel to the superposed field.

The magnetometer block is now rotated through an angle of 90° about the same axis but in the opposite direction so that core pair No. 2 is antiparallel to the superposed field. The magnetometer is now rotated 90° back to the starting position such that core pair No. 1 is again parallel to the superposed field. It will be noted that during these latter rotations, the superposed field vector will sweep through a quadrant formed by core pairs Nos. 1 and 2, which quadrant is adjacent to the 1-2 core pair quadrant that the superposed field vector swept through on the original rotations. Thus, the series of rotations just described may be designated as an adjacent quadrants tilt test.

The curves drawn by the recording milliameter during the above tilt operations are now examined. The recorded excursions or jutouts provide an indication of the block misparabolism error between core pairs Nos. 1 and 2 as well as any associated core misparabolism errors that may be present in the magnetometer. It should be noted that the amplitude separation between the positive and negative jutout peaks 36 and 37 respectively, FIG. 7, generated in the adjacent quadrants tilt test provides a direct measurement of block misparabolism error and the average jutout of these two peaks provides a direct measurement of effective core misparabolism error.

Let it be further assumed that core misparabolism error is low and that block misparabolism error is a primary error remaining in the magnetometer. If the jutouts during the first 90° tilt and return such, for example, as the jutout 36, are positive (i.e. in the direction that indicates high reductance) and the jutouts during the second (or adjacent quadrant) 90° tilt and return such as the jutout designated 37 are negative (i.e. in the direction that indicates low reductance) tilt the top of the adjustable plug member 35 installed at the top end of core 1A toward the front of the magnetometer. The amount of tilt of the shank 25 connected thereto required for a given correction is determined through previous emperical trial and error measurements of the change in block misparabolism error for a given degree of tilt of the shank.

If the jutouts during the adjacent quadrants tilt test are first negative and then positive, tilt the shank 25 of the adjustable member 35 installed at the top end of core 1A toward the back i.e. away from the front of the magnetometer. Again, the amount of tilt required for a given block misparabolism correction is determined through emperical trial and error measurements. The adjacent quadrants tilt test is repeated and jutouts 38 and 39 are obtained. The tilt of the adjustable member 35 at the top of core 1A is again readjusted as required to eliminate the remaining block misparabolism error between core pairs Nos. 1 and 2. This condition is shown at 40 on the curve, FIG. 7. In this connection it may be noted that if the effective core misparabolism of core pair Nos. 1 and 2 is zero as indicated at 40, the condition of zero block misparabolism error will be evidenced by no jutouts during the last named adjacent quadrants tilt test. If some core misparabolism errors were present, the condition of zero block misparabolism error would be evidenced by all of the jutouts in the adjacent quadrants tilt test being equal and having the same sign.

In exactly the same manner correct the block misparabolism error between core pairs Nos. 1 and 3 by adjusting the tilt of the adjustable member 35 installed at the top of core 1B toward either side of the magnetometer as required and thereafter correct the block misparabolism error between core pairs Nos. 2 and 3 by adjusting the tilt (toward either side of the magnetometer as required) of the adjustable member 35 installed at the front of core 2B.

Whereas the invention has been described with particularity with reference to a single adjustable member 35 disposed at one end of the tube 17 it will be understood that this has been done for the purposes of description and, if desired, both ends of the tube 17 may be provided with adjustable members 35 in lieu of employing the immoveable members 34. When the movable member 35 has been set to a finally adjusted position, that portion of shank 25 extending outwardly of the outer surface of block 11 is severed by a snipping operation or otherwise, care being taken not to move the member 22 from the finally adjusted position thereof.

Furthermore, if desired, the remaining three cores may be adjusted in a similar manner to cores 1A, 1B and 2B. While the invention has been described with reference to a preferred embodiment thereof for correcting block misparabolism errors it is not so limited as the invention is susceptible to many different forms, and other instrumentalities, if desired, may be substituted for those disclosed and various changes and modifications may be made without departing from the spirit and scope of the invention and it is intended therefore, in the appended claims to cover all such changes and modifications.

What is claimed as new and desired to be secured by Letters Patent of the United States is:

1. A method of correcting errors in the electrical characteristics of a total field magnetometer after the magnetometer is tested and said errors are measured and resolved, which comprises correcting the core turnover errors in said total field magnetometer by replacing a pair of cores thereof with a new pair of cores having the same total reductance as the first pair and the difference in reductance of the replaced cores different than the difference in reductance of the cores which are replaced, and subsequently correcting the block misparabolism errors in said magnetometer by adjusting at least one of the cores of the magnetometer to a new angular setting thereof so that the indication of field strength will be within prescribed limits of accuracy.

2. A method of correcting turnover errors and block misparabolism errors in individual magnetometer elements of a total field magnetometer, which comprises correcting the errors due to turnover by interchanging at least one pair of magnetic cores with another pair of like reductance, the reductance of each of said cores being different than the reductance of the individual cores which they replace, and adjusting the angular position of at least one of said cores to correct said block misparabolism errors.

3. A method of correcting errors in a total field magnetometer when said errors are due to block misparabolism between pairs of magnetometer elements in a total field magnetometer, which comprises moving at least one core of the magnetometer element angularly to bring all of the pairs of cores of said magnetometer into perfect orthogonal spaced relation.

4. A method according to claim 3 including rotation of said magnetometer 90° about a line passing through the mid point of the magnetometer and parallel to one of said pairs of cores, rotating the magnetometer back to the original position, rotating the magnetometer 90° about said line in the opposite direction, and thereafter rotating the magnetometer reversely about said line to said original position.

5. A method of correcting errors in a total field magnetometer when said errors are due to turnover in the magnetometer elements and have been determined, which comprises interchanging at least one pair of magnetic cores with another pair of like reductance, the reductance of each of said cores being different than the reductance of the individual cores they replace.

6. A method according to claim 5 including rotation of said magnetometer 180° about a line passing through a midpoint of the magnetometer and parallel to one of said pairs of cores, and thereafter rotating said magnetometer an additional 180° about said line back to the original position.

7. A method of adjusting a total field magnetometer wherein said magnetometer is placed in a constant unidirectional magnetic field of a predetermined value, said magnetometer comprising three pairs of magnetometer elements, said pairs of elements being arranged orthogonally after the magnetometer elements of said total field magnetometer have been tested and the elements having block misparabolism errors and/or having reductance errors due to core turnover have been determined which comprises, changing the setting of at least one of the cores of said magnetometer to bring all of the cores into perfect orthogonal spaced relationship and interchanging the cores of each pair of magnetometer elements for cores having the same total reductance as the cores replaced and of different reductance individually from the respective cores replaced.

8. In a total field magnetometer, a non-magnetic block substantially cubical in configuration, a plurality of magnetometer elements arranged in pairs and permanently sealed therein, the magnetic axis of each pair being mutually perpendicular to the magnetic axes of the other pairs, a plurality of movable cores within said magnetometer elements respectively, and means for moving said cores to a setting such that the magnetic axes of each pair are in a plane mutually perpendicular to the planes of each of the other pairs of cores.

9. A magnetometer according to claim 8 including a plurality of movable ceramic sleeves within which the cores are respectively arranged.

10. A magnetometer according to the claim 9 including means pivotally engaging the ends of said sleeves and settable at will to different positions for moving said sleeves to desired positions such that the magnetic axes of each pair of cores within said sleeves are mutually perpendicular to each of the other pairs of cores.

11. A magnetometer according to claim 10 including means for maintaining the core moving means in said desired positions.

* * * * *